United States Patent
Liu et al.

(10) Patent No.: US 10,996,699 B2
(45) Date of Patent: May 4, 2021

(54) LOW DROP-OUT (LDO) VOLTAGE REGULATOR CIRCUIT

(71) Applicant: STMicroelectronics Asia Pacific Pte Ltd, Singapore (SG)

(72) Inventors: Qing Liu, Singapore (SG); Yannick Guedon, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 14 days.

(21) Appl. No.: 16/525,696

(22) Filed: Jul. 30, 2019

(65) Prior Publication Data

US 2021/0034087 A1    Feb. 4, 2021

(51) Int. Cl.
    *G05F 1/575*     (2006.01)
    *H03F 3/45*     (2006.01)

(52) U.S. Cl.
    CPC ......... *G05F 1/575* (2013.01); *H03F 3/45179* (2013.01); *H03F 2200/129* (2013.01); *H03F 2203/45116* (2013.01); *H03F 2203/45526* (2013.01)

(58) Field of Classification Search
    CPC .......... G05F 1/575; G05F 3/265; G05F 3/267; H03F 3/45179; H03F 2200/129; H03F 2203/45116; H03F 2203/45526
See application file for complete search history.

(56) References Cited

U.S. PATENT DOCUMENTS

| 5,559,424 | A  | * | 9/1996  | Wrathall        | G05F 3/267 323/277 |
| 6,188,211 | B1 |   | 2/2001  | Rincon-Mora et al. |                    |
| 6,969,982 | B1 | * | 11/2005 | Caldwell        | G05F 3/265 323/273 |

(Continued)

FOREIGN PATENT DOCUMENTS

WO      2012007942 A2      1/2012

OTHER PUBLICATIONS

"A dynamic-biased dual-loop-feedback CMOS LDO regulator with fast transient response," W. Han, S. Maomao, Journal of Semiconductors, vol. 35, No. 4, 045005-1-045005-9, Apr. 2014 (Year: 2014).*

(Continued)

*Primary Examiner* — Kyle J Moody
*Assistant Examiner* — Jye-June Lee
(74) *Attorney, Agent, or Firm* — Crowe & Dunlevy

(57) ABSTRACT

A low drop-out (LDO) voltage regulator circuit includes a power transistor having a control terminal configured to receive a control signal and an output terminal coupled to an output node. A current regulation loop senses current flowing through the power transistor and modulates the control signal to cause the power transistor to output a constant current to the output node. A voltage regulation loop senses voltage at the output node and modulates the control signal to cause the power transistor to deliver current to the output node so that an output voltage at the output node is regu- (Continued)

lated. The current regulation loop includes a bipolar transistor connected to the control terminal of the power transistor, where a base terminal of the bipolar transistor is driven by a signal dependent on a difference between the sensed current flowing through the power transistor and a reference.

31 Claims, 4 Drawing Sheets

(56) References Cited

U.S. PATENT DOCUMENTS

| | | | |
|---|---|---|---|
| 7,459,886 B1 | 12/2008 | Potanin et al. | |
| 8,160,654 B2 | 4/2012 | Onishi et al. | |
| 8,629,649 B2 | 1/2014 | Guo et al. | |
| 2013/0271100 A1* | 10/2013 | El-Nozahi | G05F 1/575 |
| | | | 323/280 |
| 2013/0293986 A1* | 11/2013 | Lerner | G05F 1/573 |
| | | | 361/18 |
| 2016/0154415 A1* | 6/2016 | B z itu | G05F 1/575 |
| | | | 323/280 |

OTHER PUBLICATIONS

Chia-Hsiang Lin, Chun-Yu Hsieh, Ke-Homg Chen: "A Li-Ion Battery Charger With Smooth Control Circuit and Built-In Resistance Compensator for Achieving Stable and Fast Charging", IEEE Trans. on Circuits and Systems 57-I(2): 506-517 (2010).

* cited by examiner

LOW DROP-OUT (LDO) VOLTAGE REGULATOR CIRCUIT

TECHNICAL FIELD

Embodiments generally relate to a low drop-out (LDO) voltage regulator circuit and, in particular, to an LDO voltage regulator circuit that is adaptable to a wide range of charging applications.

BACKGROUND

With reference to FIG. 1, a conventional multi-mode low drop-out (LDO) voltage regulator circuit 10 is configured to support operation in one mode to enable a voltage regulation loop 14 to regulate the delivery of a voltage at a load 16 and in another mode to enable a current regulation loop 18 to regulate the delivery of a current to the load 16. The output voltage Vout from the circuit 10 at the load 16 is sensed using a resistive voltage divider formed by the series connection of resistor R1 and resistor R2. The tap node of the resistive voltage divider generates a feedback voltage Vfb. A voltage comparator circuit 20 compares the feedback voltage Vfb to an output reference voltage Vref_out to generate an enable signal En_V for controlling the enabling of operation of the voltage regulation loop 14. The enable signal En_V is deasserted (for example, logic low) by the voltage comparator circuit 20, and the voltage regulation loop 14 is disabled, if the feedback voltage Vfb is less than the output reference voltage Vref_out. Conversely, the enable signal En_V is asserted (for example, logic high) by the voltage comparator circuit 20, and the voltage regulation loop 14 is enabled, if the feedback voltage Vfb is greater than the output reference voltage Vref_out. A logic inverter circuit 22 inverts the logic state of the enable signal En_V to generate an enable signal En_C for controlling the enabling of operation of the current regulation loop 18. The enable signal En_C is asserted (for example, logic high) by the logic inverter circuit 22, and the current regulation loop 18 is enabled, if the feedback voltage Vfb is less than the output reference voltage Vref_out. Conversely, the enable signal En_C is deasserted (for example, logic low) by the logic inverter circuit 22, and the current regulation loop 14 is disabled, if the feedback voltage Vfb is greater than the output reference voltage Vref_out.

A power MOSFET device 24 has a source-drain current path coupled between an input voltage (Vin) node and the output voltage (Vout) node and is controlled to source a current to the output node. More specifically, the drain terminal of transistor 24 is coupled to the input voltage (Vin) node and a source terminal of transistor 24 is coupled to the output voltage (Vout) node. The gate terminal of the transistor 24 is configured to receive a gate voltage Vgate.

The voltage regulation loop 14, when enabled by the enable signal En_V, controls the transistor 24 to deliver current to the load 16 in order to regulate the output voltage Vout at a level where the feedback voltage Vfb is substantially equal to a voltage regulation reference voltage Vref_vol (where Vref_out<Vref_vol). The gate voltage Vgate driving the gate terminal of the transistor 24 is generated by a differential voltage amplifier 30 having a first input configured to receive the feedback voltage Vfb and a second input configured to receive the voltage regulation reference voltage Vref_vol.

The current regulation loop 18, when enabled by the enable signal En_C, controls the transistor 24 to deliver a regulated constant current to the load 16. A current sensing circuit 32 senses the magnitude of the current flowing in the source-drain path of the transistor 24 and generates a feedback voltage Cfb indicative of that sensed current magnitude. The gate voltage Vgate driving the gate terminal of the transistor 24 is generated by a differential voltage amplifier 34 having a first input configured to receive the feedback voltage Cfb and a second input configured to receive a current regulation reference voltage Vref_cur. The differential voltage amplifier 34 drives the transistor 24 so that the feedback voltage Cfb is substantially equal to the current regulation reference voltage Vref_cur.

The voltage comparator circuit 20 and logic inverter circuit 22 exercise a digitally controlled transition between the constant voltage mode (i.e., when the voltage regulation loop 14 is enabled) and the constant current mode (i.e., when current regulation loop 18 is enabled). It is noted that undesirable current and voltage glitches can occur when switching from the constant current mode to the constant voltage mode. These glitches arise as a consequence of the digitally controlled mode switching operation. In some applications of the LDO circuit 10, these glitches present a serious concern. For example, if the load 16 is highly capacitive (such as in the range of 1-10 mF or even higher up to 1F, sometimes referred to in the art as a "super-cap" load as might be associated with the load 116 being a rechargeable battery that is charged by the LDO circuit), the magnitude of the current glitch can quickly reach a level of tens of Amps before transient protection circuitry has time to react. Glitches of this magnitude can have an adverse impact on the load circuit (for example, damaging the battery).

The reference by Chia-Hsiang Lin, et al., "A Li-Ion Battery Charger With Smooth Control Circuit and Built-In Resistance Compensator for Achieving Stable and Fast Charging", IEEE Trans. on Circuits and Systems 57-I(2): 506-517 (2010), incorporated by reference, teaches an analog switching technique for changing between constant voltage and constant charging modes. However, it is noted that during mode transition where the output voltage is approaching the targeted value, the voltage regulation loop tends to want to increase the gate voltage whereas the current regulation loop tends to want to decrease the gate voltage. Because the output impedance of the differential amplifier in the current regulation loop is low, the current regulation loop is incapable of immediately turning off. The push-pull between the two regulation loops induces ringing/oscillations for a time period before the voltage regulation loop fully takes over control. It is worthwhile to note that induced ringing/oscillations will be exacerbated in the case where the load is highly capacitive (such as with a "super-cap" implementation as described above). The reason for this is that the capacitive load will prolong the duration of time over which the push-pull between the two regulation loops occurs.

There is accordingly a need in the art for an LDO voltage regulator circuit that is capable of supporting regulation with both less capacitive and highly capacitive loads.

SUMMARY

In an embodiment, a low drop-out (LDO) voltage regulator circuit comprises: a power transistor having a control terminal configured to receive a control signal and an output terminal coupled to an output node; a current regulation loop configured to sense current flowing through the power transistor and modulate the control signal to cause the power transistor to output a constant current to the output node; and a voltage regulation loop configured to sense voltage at the output node and modulate the control signal to cause the power transistor to deliver current to the output node so that an output voltage at the output node is regulated. The current regulation loop comprises a bipolar transistor having a first conduction terminal connected to the control terminal of the power transistor and having a base terminal driven by a signal that depends on a difference between the sensed current flowing through the power transistor and a reference.

In an embodiment, a low drop-out (LDO) voltage regulator circuit comprises: a power transistor having a control terminal and an output terminal coupled to an output node; a current sensing circuit configured to sense current flowing through the power transistor and generate a first sense signal; a voltage sensing circuit configured to sense voltage at the output node and generate a second sense signal; a first differential amplifier having a first input configured to receive the first sense signal and a second input configured to receive a first reference; a second differential amplifier having a first input configured to receive the second sense signal and a second input configured to receive a second reference; and a bipolar transistor having a control terminal configured to receive a signal output from the first differential amplifier and having a conduction terminal configured to apply a signal to the control terminal of the power transistor; wherein a signal output from the second differential amplifier is applied to the control terminal of the power transistor

BRIEF DESCRIPTION OF THE DRAWINGS

For a better understanding of the embodiments, reference will now be made by way of example only to the accompanying figures in which.

DETAILED DESCRIPTION

Figure 1:
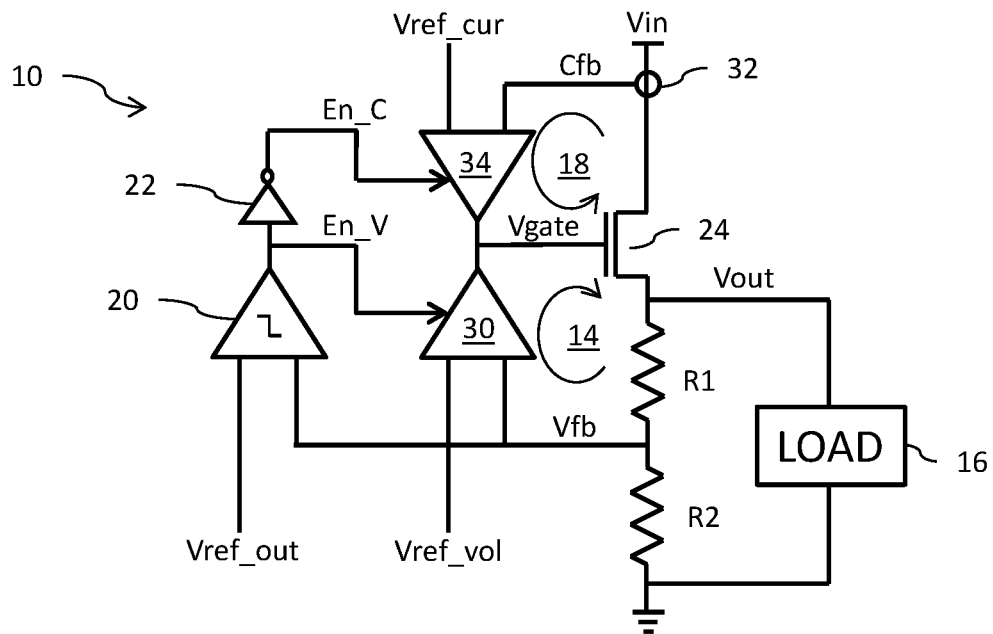
FIG. 1 is a block diagram of a conventional multi-mode low drop-out (LDO) voltage regulator circuit.
Figure 2:
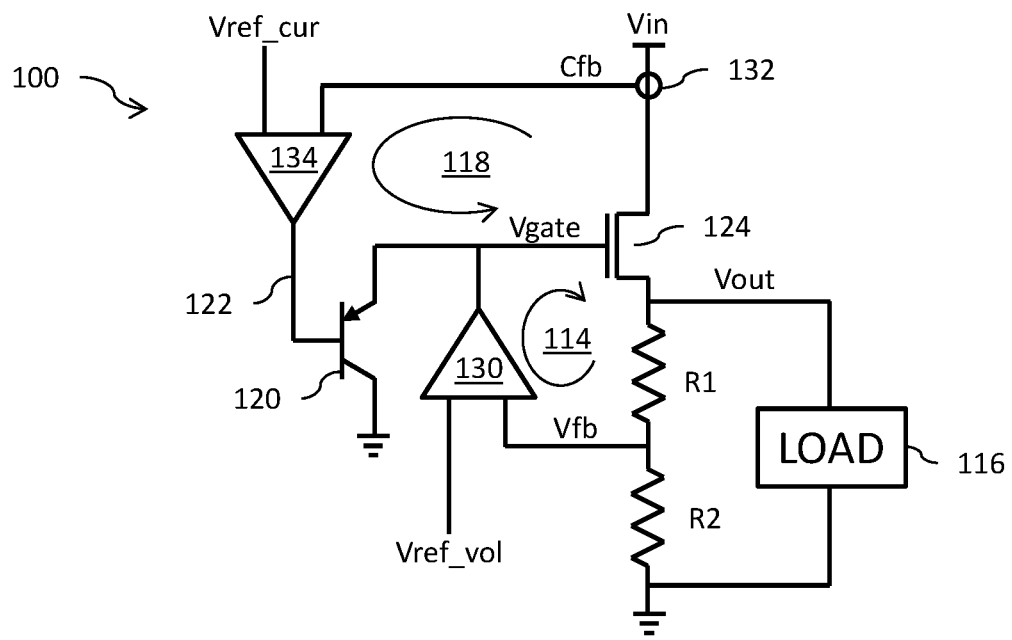
FIG. 2 is a block diagram of a multi-mode LDO voltage regulator circuit.

Reference is now made to FIG. 2 which shows a block diagram of a multi-mode low drop-out (LDO) voltage regulator circuit 100 configured to support operation in one mode to enable a voltage regulation loop 114 to regulate the delivery of a voltage at a load 116 and in another mode to enable a current regulation loop 118 to regulate the delivery of a current to the load 116. A power MOSFET device 124 has a source-drain current path coupled between an input voltage (Vin) node and the output voltage (Vout) node and configured to source a current to the output node. More specifically, the drain terminal of transistor 124 is coupled to the input voltage (Vin) node and a source terminal of transistor 124 is coupled to the output voltage (Vout) node. The gate terminal of the transistor 124 is configured to receive a gate voltage Vgate. The output voltage Vout at the load 116 is sensed using a resistive voltage divider formed by the series connection of resistor R1 and resistor R2. The tap node of the resistive voltage divider generates a feedback voltage Vfb. A current sensing circuit 132 senses the magnitude of the current flowing in the source-drain path of the transistor 124 and generates a feedback voltage Cfb indicative of that sensed current magnitude.

The voltage regulation loop 114 controls the transistor 124 to deliver current to the load 116 in order to regulate the output voltage Vout at a level where the feedback voltage Vfb is substantially equal to a voltage regulation reference voltage Vref_vol. The gate voltage Vgate driving the gate terminal of the transistor 124 is generated by a differential voltage amplifier 130 having a first input configured to receive the feedback voltage Vfb and a second input configured to receive the voltage regulation reference voltage Vref_vol. The voltage regulation loop 114 thus modulates the gate voltage Vgate driving the gate terminal of the transistor 124 such that the current delivered by the transistor 124 will regulate the output voltage Vout at the load 116.

The current regulation loop 118 controls the transistor 124 to deliver a regulated constant current to the load 116. The gate voltage Vgate driving the gate terminal of the transistor 124 is controlled by a PNP bipolar transistor 120 having an emitter terminal connected to the gate terminal of the transistor 124 and a collector terminal connected to a power supply reference (such as ground). A base terminal of bipolar transistor 120 receives a control signal 122 generated by a differential voltage amplifier 134 having a first input configured to receive the feedback voltage Cfb and a second input configured to receive a current regulation reference voltage Vref_cur. The differential voltage amplifier 134 and bipolar transistor 120 control conductivity of the transistor 124 so that the feedback voltage Cfb is substantially equal to the current regulation reference voltage Vref_cur. The current regulation loop 118 thus modulates the gate voltage Vgate driving the gate terminal of the transistor 124 such that a constant current of a desired magnitude is delivered by the transistor 124 to the load 116.

The bipolar transistor 120 functions as an analog switch to turn off the current regulation loop 118. Advantageously, the bipolar transistor 120 has a high base impedance which does not reduce the gain of the current regulation loop 118. This assists in assuring a smooth transition between modes. Furthermore, the bipolar transistor 120 features a high current gain with low emitter impedance. This assists the operation of the current regulation loop 118 to clamp the gate voltage Vgate in the context of subsequently achieving the delivery of a constant current to the load.

Constant current mode: Assume operation of the LDO voltage regulator circuit 100 where the output voltage Vout is at a level such that the feedback voltage Vfb is much less than the voltage regulation reference voltage Vref_vol. The voltage regulation loop 114 will control the transistor 124 through the gate voltage Vgate to increase the magnitude of the current being delivered to the load 116. This current is sensed by the current sensing circuit 132. When the feedback voltage Cfb rises due to the increasing current to be substantially equal to the current regulation reference voltage Vref_cur, the differential voltage amplifier 134 of the current regulation loop 118 triggers the turn on of the bipolar transistor 120 which clamps the gate voltage Vgate at a voltage level for the transistor 124 to deliver a constant current to the load 116 having a desired magnitude. The active bipolar transistor 120 with low emitter impedance reduces the voltage loop gain (by reducing the output impedance of the differential voltage amplifier 130) in order to ensure regulation by the current regulation loop 118. It will be noted that the differential voltage amplifier 130 can be implemented with a current limiter or limited current source (as will be explained elsewhere herein) in order to assist the bipolar transistor 120 in clamping the gate voltage Vgate.

Transition from constant current mode to constant voltage mode: Assume now that as a result of the constant charging operation the output voltage Vout has risen to a level such that the feedback voltage Vfb is close to the voltage regulation reference voltage Vref_vol. The differential voltage amplifier 130 responds by reducing the gate voltage Vgate (i.e., reducing the voltage to a level that is below the clamp voltage imposed by the bipolar transistor 120 of the current regulation loop 118). As a result, there will be a corresponding reduction in the current delivered by the transistor 124 to the load 116. This reduction in current is sensed by the current sensing circuit 132. Because of the high gain of the current regulation loop 118, the reduction in sensed current is sufficient for the differential voltage amplifier 134 of the current regulation loop 118 to turn off the bipolar transistor 120 and hand over control to the voltage regulation loop 114. It will be noted that the differential voltage amplifier 134 may be configured to use a large Miller capacitor in order to ensure loop stability and reduce loop bandwidth. The provision of a lower bandwidth for the current regulation loop 118 will ensure that the LDO circuit 100 does not inadvertently switch back to constant current mode during the mode transition to move to voltage regulation.

Figure 3A:
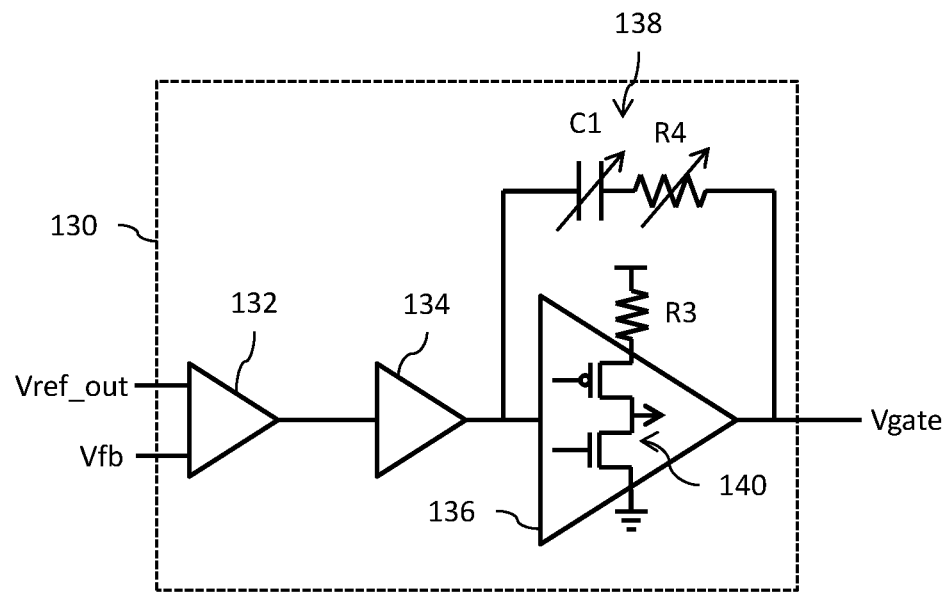
FIGS. 3A-3B illustrate circuit implementations for the differential voltage amplifier of the LDO voltage regulator circuit of FIG. 2.
Figure 3B:
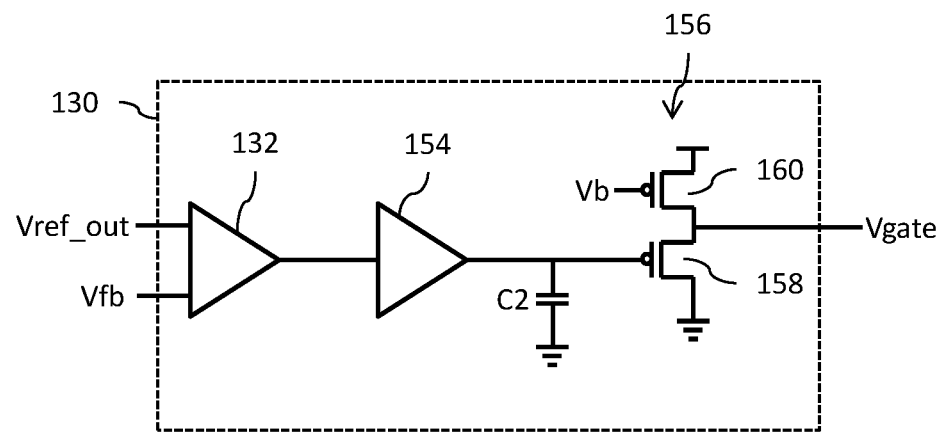

The circuit configuration for the differential voltage amplifier 130 can be designed specifically for the type of load 116. For a standard capacitive load (for example, 250 nF to 10 µF), the differential voltage amplifier 130 may have a circuit configuration as shown by FIG. 3A. For a super-cap load (for example, 1 mF to 1 F), the differential voltage amplifier 130 may have a circuit configuration as shown by FIG. 3B.

Reference is now made to FIG. 3A which illustrates a circuit implementation for the differential voltage amplifier 130. A differential input stage 132 has a first input configured to receive the feedback voltage Vfb and a second input configured to receive the output reference voltage Vref_out. An output of the differential input stage 132 is applied to the input of a first gain stage 134. An output of the first gain stage 134 is applied to the input of a second gain stage 136. The output of the second gain stage 136 is fed back to the input of the second gain stage 136 by a feedback circuit 138 formed by the series connection of a variable capacitor C1 and a variable resistor R4. The output from the second gain stage 136 provides the gate voltage Vgate. An output driver circuit 140 of the second gain stage 136 is source biased by a limited current produced by a current limiting resistor R3 (or alternatively by a bias voltage limited current source circuit).

Figure 4A:
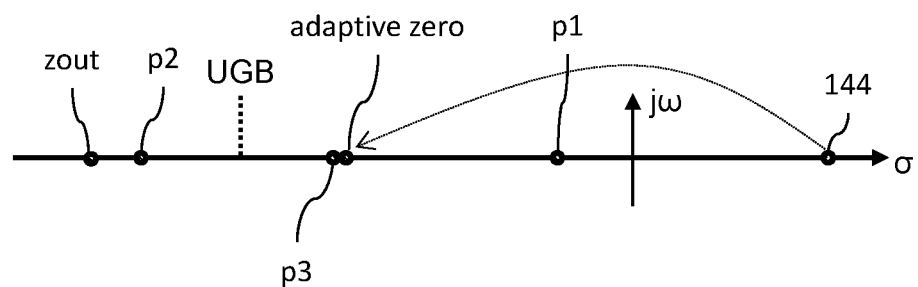
FIGS. 4A-4B illustrate pole-zero plots for the LDO voltage regulator when using the differential voltage amplifiers of FIGS. 3A-3B, respectively.

FIG. 4A is a plot of the poles and zeroes for the LDO circuit 100 with use of the differential voltage amplifier 130 shown in FIG. 3A, where:

$$zout = -\frac{1}{Rload * Cload},$$

with Rload being the resistance of the load 116 and Cload being the capacitance of the load;

$$\text{adaptive zero} = \frac{1}{\left(\frac{1}{gm2} - R4(Iout)\right)C1},$$

with gm2 being the transconductance of the second gain stage 136 and R4(Iout) being the variable resistance value which is dependent on Iout (the source-drain current in power transistor 124), where $$R4(Iout) = \frac{1}{K * Iout} Cload,$$

with k being a design coefficient;

$$p1 = -\frac{1}{ro1(gm2 * Rgate)C1},$$

with ro1 being the output impedance of the first gain stage amplifier 134 and Rgate being the input impedance of the power transistor 124;

$$p2 = -\frac{gm2}{Cgp},$$

with Cgp being the gate capacitance of transistor 124;

$$p3 = -\frac{1}{\frac{1}{gmp} * Cload},$$

with gmp being the transconductance of transistor 124;
UGB is the unity gain bandwidth;
reference 144 is at $$\frac{gm2}{C1}$$

which is the zero location in the absence of R4 (which is the adaptive zero); the arrow shows that the zero is shifted to the left half plane and becomes adaptive by means of the variable resistance R4;
jω is the imaginary axis; and $$R4 * C1 = \frac{1}{gmp} Cload = \frac{1}{k * Iout} Cload,$$

where this makes the zero adaptive to the moving pole p3 where both are determined by Iout (or gmp). As a consequence, the adaptive zero cancels the moving pole p3 in order to ensure loop stability.

Loop stability is ensured through use of a Miller capacitor to split the poles p1 and p2. The adaptive zero is used to cancel the moving pole p3 at the output, particularly in the case of the pole p3 moving into UGB. Zout is at a high frequency due to the small value of the load capacitance Cload. It is imperative to ensure that there is effectively only one pole within UGB to achieve loop stability; a pair of poles and zero inside UGB cancel each other.

Reference is now made to FIG. 3B which illustrates a circuit implementation for the differential voltage amplifier 130. A differential input stage 132 has a first input configured to receive the feedback voltage Vfb and a second input configured to receive the output reference voltage Vref_out. An output of the differential input stage 132 is applied to the input of a first gain stage 154. An output of the first gain stage 154 is connected to a capacitor C2 provided to limit the UGB and thereby ensure loop stability. The output of the first gain stage 154 is further applied to the input of a second gain stage 156. The output of the second gain stage 156 provides the gate voltage Vgate. The second gain stage 156 is formed by a first p-type MOSFET device 158 configured as a source-follower transistor with a gate terminal configured to receive the output of the first gain stage 154, a drain terminal connected to a power supply reference voltage (for example, ground) and a source terminal connected to generate the gate voltage Vgate. The source-follower transistor 158 is biased by a bias current generated by a second p-type MOSFET device 160 operating as a current source with a source terminal connected to a power supply reference voltage (for example, Vdd), a drain terminal connected to the source terminal of transistor 158 and a gate terminal receiving a bias voltage Vb.

Figure 4B:
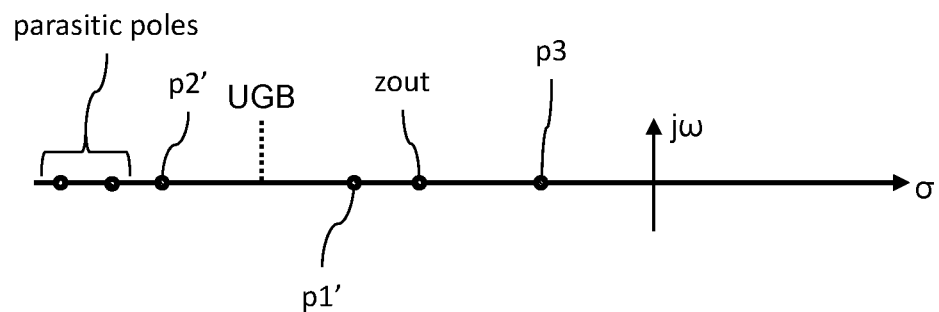

FIG. 4B is a plot of the poles and zeroes for the LDO circuit 100 with use of the differential voltage amplifier 130 shown in FIG. 3B, where:

$$zout = -\frac{1}{Rload * Cload},$$

with Rload being the resistance of the load 116 and Cload being the capacitance of the load;

$$p1' = -\frac{1}{ro1'(C2 + Cx)},$$

with ro1' being the output impedance of the first gain stage amplifier 154 and Cx being the total parasitic capacitance at the output of the first gain stage amplifier 154;

$$p2' = -\frac{gm2'}{Cgp},$$

with gm2' being the transconductance of the source-follower transistor 158 and Cgp being the gate capacitance of transistor 124; and $$p3 = -\frac{1}{\left(\frac{1}{gmp} + Rload\right) Cload},$$

with gmp being the transconductance of transistor 124;
UGB is the unity gain bandwidth; and
jω is the imaginary axis.

In this case, the pole p3 and the zero (zout) at the output both sit a low frequency within the unity gain bandwidth due to the large capacitance (Cload) of the load 116. The zero (zout) is at a fixed frequency that is determined by Rload and Cload. The pole p3 sits at a position that changes with output current depending on change in gmp as shown by the expression for p3 above. Notwithstanding the output current, however, the pole p3 is always at a lower frequency than zout.

In order to stabilize the loop, the circuit introduces the pole p1' at a location close to, but not exceeding, the frequency of zout. This enables the loop gain to drop below 0 dB before entering the undesirable high frequency regime (associated with the pole p2' and the parasitic poles). The position of the pole p1' can be adjusted by properly choosing the capacitance of the capacitor C2 at the output of the first gain stage amplifier 154. Thus, there are two poles and one zero within the unity gain bandwidth, and the relative positions are p3, zero and p1' from the low frequency to the unity gain bandwidth.

Figure 5:
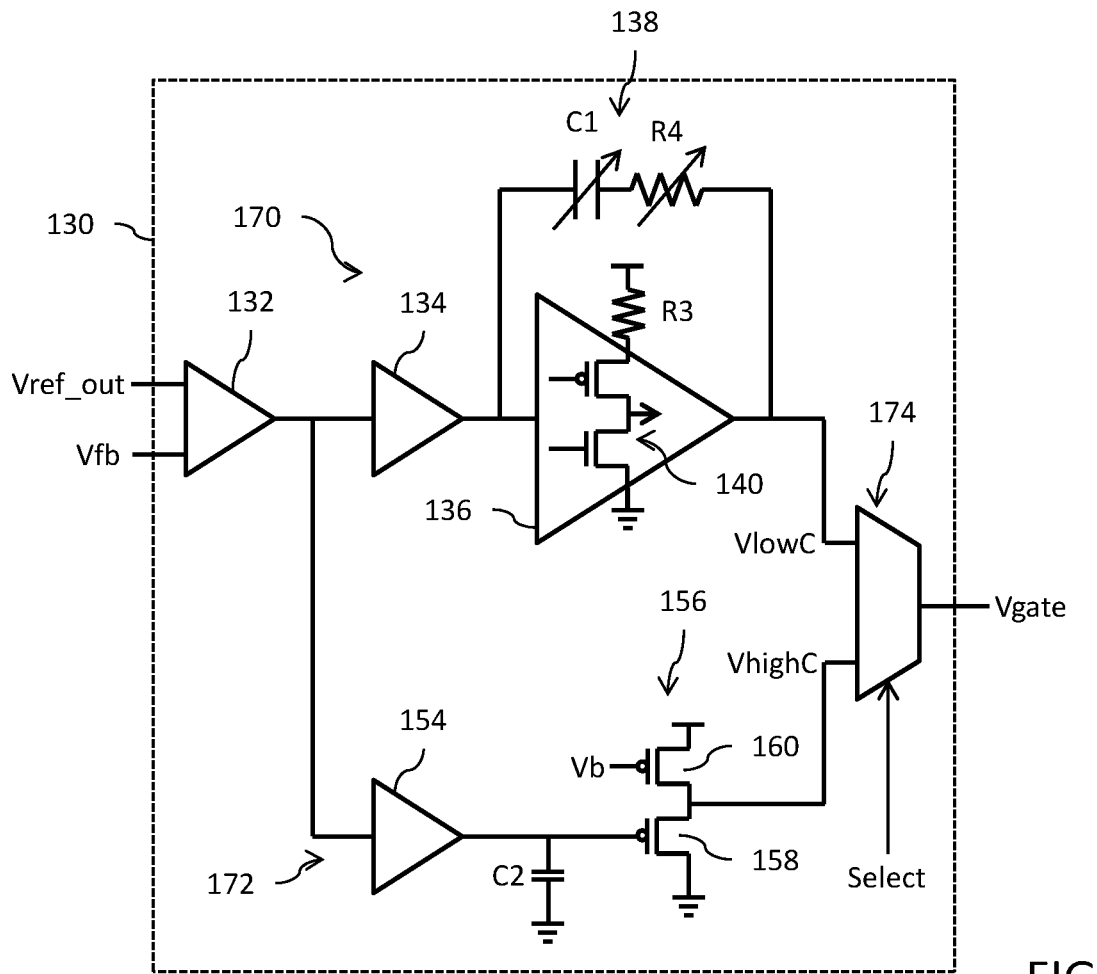
FIG. 5 illustrates a circuit implementation for the differential voltage amplifier of the LDO voltage regulator circuit of FIG. 2.

Reference is now made to FIG. 5 which illustrates a circuit implementation for the differential voltage amplifier 130. The circuit 130 of FIG. 5 is a combination of the circuits of FIGS. 3A and 3B. The circuit of FIG. 3A, generally shown at reference 170, operates in response to the feedback voltage Vfb and the output reference voltage Vref_out to generate a first voltage VlowC for application by the voltage regulation loop 114 to the power transistor 124 as the gate voltage Vgate. The circuit of FIG. 3B, generally shown at reference 172, operates in response to the feedback voltage Vfb and the output reference voltage Vref_out to generate a second voltage VhighC for application by the voltage regulation loop 114 to the power transistor 124 as the gate voltage Vgate. It will be noted that the circuits 170 and 172 share a common differential input stage 132 providing output to first gain stages 134 and 154, respectively. An analog multiplexer circuit 172 has inputs that receive the first voltage VlowC and the second voltage VhighC and operates to select one of the input voltages for output as the gate voltage Vgate in response to a select signal (Select) that is, for example, an externally generated configuration signal.

An advantage of the differential voltage amplifier 130 of FIG. 5 is that the LDO circuit 100 can be tuned for operation dependent on the capacitance of the load 116. In the case of a relatively lower load capacitance (for example, 250 nF to 10 μF), the select signal (Select) can control the multiplexer 174 to pass the first voltage VlowC generated by circuit 170 as the gate voltage Vgate. In the case of a relatively higher load capacitance (for example, 1 mF to 1 F), the select signal (Select) can control the multiplexer 174 to pass the second voltage VhighC generated by circuit 172 as the gate voltage Vgate.

Figure 6:
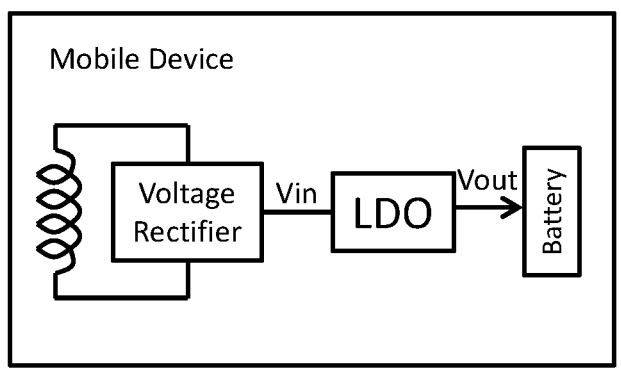
FIG. 6 shows an example application for the LDO circuit.

Reference is now made to FIG. 6 which shows an example application for the LDO circuit 100. A mobile device, such as a cellular telephone, is typically powered by a battery which needs to be recharged. It is desired for such a mobile device to support a wireless charging feature. To accomplish this function, the mobile device includes an antenna coupled to a rectifier circuit which converts the AC signal received by the to a DC voltage Vin. The LDO circuit receives the voltage Vin and generates a current for charging the battery to the voltage level Vout.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:
1. A low drop-out (LDO) voltage regulator circuit, comprising:

a power transistor having a control terminal configured to receive a control signal and an output terminal coupled to an output node;

a current regulation loop configured to sense current flowing through the power transistor and modulate the control signal to cause the power transistor to output a constant current to the output node; and a voltage regulation loop configured to sense voltage at the output node and modulate the control signal to cause the power transistor to deliver current to the output node so that an output voltage at the output node is regulated;

wherein the current regulation loop comprises a control transistor having a first conduction terminal connected to the control terminal of the power transistor and having a control terminal driven by a signal that depends on a difference between the sensed current flowing through the power transistor and a reference;

wherein the voltage regulation loop comprises:

a differential input circuit having a first input configured to receive the voltage sensed at the output node and a second input configured to receive a voltage regulation reference voltage; and a gain circuit having an input coupled to an output of the differential input circuit and an output configured to generate the control signal for application to the control terminal of the power transistor;

wherein the gain circuit includes a feedback circuit having a resistor and a capacitor coupled in series, wherein a resistance of the resistor and a capacitance of the capacitor set a zero for canceling a pole at the output node.

2. The circuit of claim 1, wherein the first conduction terminal of the bipolar transistor is an emitter terminal.

3. The circuit of claim 1, wherein the power transistor is a MOSFET device.

4. The circuit of claim 3, wherein the output terminal of the power transistor MOSFET device is a source terminal.

5. The circuit of claim 1, wherein the pole at the output node is set by a load circuit connected to the output node.

6. The circuit of claim 1, wherein the resistor is a variable resistor and the capacitor is a variable capacitor.

7. The circuit of claim 1, wherein the gain circuit comprises:

a first gain stage having an input coupled to the output of the differential input circuit; and a second gain stage having an input coupled to an output of the first gain stage;

wherein the feedback circuit is coupled between the output of the second gain stage and the input of the second gain stage.

8. The circuit of claim 7, wherein the second gain stage includes an output drive circuit having a current limiting source circuit.

9. The circuit of claim 8, wherein the current limiting source circuit is a current limiting resistor.

10. The circuit of claim 1, wherein the control transistor is a bipolar transistor and wherein the power transistor is a MOSFET device.

11. A low drop-out (LDO) voltage regulator circuit, comprising:

a power transistor having a control terminal configured to receive a control signal and an output terminal coupled to an output node;

a current regulation loop configured to sense current flowing through the power transistor and modulate the control signal to cause the power transistor to output a constant current to the output node; and a voltage regulation loop configured to sense voltage at the output node and modulate the control signal to cause the power transistor to deliver current to the output node so that an output voltage at the output node is regulated;

wherein the current regulation loop comprises a control transistor having a first conduction terminal connected to the control terminal of the power transistor and having a control terminal driven by a signal that depends on a difference between the sensed current flowing through the power transistor and a reference;

wherein the voltage regulation loop comprises:

a differential input circuit having a first input configured to receive the voltage sensed at the output node and a second input configured to receive a voltage regulation reference voltage; and a gain circuit having an input coupled to an output of the differential input circuit and an output configured to generate the control signal for application to the control terminal of the power transistor;

wherein the gain circuit includes a capacitor having a capacitance to set a pole at a frequency that does not exceed a zero at the output node.

12. The circuit of claim 11, wherein the zero at the output node is set by a load circuit connected to the output node.

13. The circuit of claim 11, wherein the gain circuit comprises:

a first gain stage having an input coupled to the output of the differential input circuit; and a second gain stage having an input coupled to an output of the first gain stage;

wherein the capacitor has a first terminal connected to the output of the first gain stage and a second terminal connected to a power supply reference voltage.

14. The circuit of claim 13, wherein the power supply reference voltage is ground.

15. The circuit of claim 13, wherein the second gain stage comprises a source-follower transistor.

16. The circuit of claim 15, wherein the second gain stage further comprises a current source configured to bias the source-follower transistor.

17. The circuit of claim 11, wherein the first conduction terminal of the bipolar transistor is an emitter terminal.

18. The circuit of claim 11, wherein the power transistor is a MOSFET device.

19. The circuit of claim 18, wherein the output terminal of the power transistor MOSFET device is a source terminal.

20. The circuit of claim 11, wherein the control transistor is a bipolar transistor and wherein the power transistor is a MOSFET device.

21. A low drop-out (LDO) voltage regulator circuit, comprising:

a power transistor having a control terminal configured to receive a control signal and an output terminal coupled to an output node;

a current regulation loop configured to sense current flowing through the power transistor and modulate the control signal to cause the power transistor to output a constant current to the output node; and a voltage regulation loop configured to sense voltage at the output node and modulate the control signal to cause the power transistor to deliver current to the output node so that an output voltage at the output node is regulated;

wherein the current regulation loop comprises a control transistor having a first conduction terminal connected to the control terminal of the power transistor and having a control terminal driven by a signal that depends on a difference between the sensed current flowing through the power transistor and a reference;

wherein the voltage regulation loop comprises:
a differential input circuit having a first input configured to receive the voltage sensed at the output node and a second input configured to receive a voltage regulation reference voltage;
a first amplifier circuit having an input coupled to an output of the differential input circuit, the first amplifier circuit configured to generate a first control signal;
a second amplifier circuit having an input coupled to the output of the differential input circuit, the second amplifier circuit configured to generate a second control signal; and
an analog multiplexer circuit having a first input configured to receive the first control signal and a second input configured to receive the second control signal, wherein the analog multiplexer circuit selectively passes one of the first and second control signals as the control signal applied to the control terminal of the power transistor in response to a select signal.

22. The circuit of claim 21, wherein the first amplifier circuit comprises:
a gain circuit having an input coupled to an output of the differential input circuit and an output configured to generate the first control signal;
wherein the gain circuit includes a feedback circuit having a resistor and a capacitor coupled in series, wherein a resistance of the resistor and a capacitance of the capacitor set a zero for canceling a pole at the output node.

23. The circuit of claim 22, wherein the gain circuit comprises:

a first gain stage having an input coupled to the output of the differential input circuit; and
a second gain stage having an input coupled to an output of the first gain stage;
wherein the feedback circuit is coupled between the output of the second gain stage and the input of the second gain stage.

24. The circuit of claim 23, wherein the second gain stage includes an output drive circuit having a current limiting source circuit.

25. The circuit of claim 21, wherein the second amplifier circuit comprises:
a gain circuit having an input coupled to an output of the differential input circuit and an output configured to generate the second control signal;
wherein the gain circuit includes a capacitor having a capacitance to set a pole at a frequency that does not exceed a zero at the output node.

26. The circuit of claim 25, wherein the gain circuit comprises:
a first gain stage having an input coupled to the output of the differential input circuit; and
a second gain stage having an input coupled to an output of the first gain stage;
wherein the capacitor has a first terminal connected to the output of the first gain stage and a second terminal connected to a power supply reference voltage.

27. The circuit of claim 26, wherein the second gain stage comprises a source-follower transistor.

28. The circuit of claim 21, wherein the first conduction terminal of the bipolar transistor is an emitter terminal.

29. The circuit of claim 21, wherein the power transistor is a MOSFET device.

30. The circuit of claim 29, wherein the output terminal of the power transistor MOSFET device is a source terminal.

31. The circuit of claim 21, wherein the control transistor is a bipolar transistor and wherein the power transistor is a MOSFET device.

* * * * *